(12) United States Patent
Thomas (10) Patent No.: US 6,392,397 B1
(45) Date of Patent: May 21, 2002

(54) METHOD AND APPARATUS FOR SPECTRUM ANALYSIS BY CREATING AND MANIPULATING CANDIDATE SPECTRA

(75) Inventor: Neil Edwin Thomas, Stevenage (GB)

(73) Assignee: IFR Limited, Stevenage (GB)

( * ) Notice: Subject to any disclaimer, the term of this patent is extended or adjusted under 35 U.S.C. 154(b) by 0 days.

(21) Appl. No.: 09/446,514

(22) PCT Filed: Jun. 24, 1998

(86) PCT No.: PCT/GB98/01868

§ 371 Date: Mar. 16, 2000

§ 102(e) Date: Mar. 16, 2000

(87) PCT Pub. No.: WO98/59252

PCT Pub. Date: Dec. 30, 1998

(30) Foreign Application Priority Data

Jun. 25, 1997 (GB) ................................. 973305

(51) Int. Cl.[7] ........................ G01R 19/00; G01R 23/16; G01R 13/24
(52) U.S. Cl. ................. 324/76.11; 324/76.22; 324/76.27
(58) Field of Search ............. 324/76.11, 76.22, 324/76.27; 341/155

(56) References Cited

U.S. PATENT DOCUMENTS

| | | | | |
|---|---|---|---|---|
| 4,673,871 A | * | 6/1987 | Brown et al. ............ | 324/76.11 |
| 4,848,354 A | * | 7/1989 | Angelsen et al. ........... | 600/441 |
| 4,918,382 A | * | 4/1990 | Bales et al. .............. | 324/76.22 |
| 5,444,816 A | * | 8/1995 | Adoul et al. ................ | 704/219 |
| 5,629,703 A | * | 5/1997 | Lewallen .................... | 341/155 |
| 5,736,845 A | * | 4/1998 | Kosuge .................. | 324/76.27 |

* cited by examiner

*Primary Examiner*—Safet Metjahic
*Assistant Examiner*—Wasseem H. Hamdan
(74) *Attorney, Agent, or Firm*—Reising, Ethington, Barnes, Kisselle, Learman and McCulloch, P.C.

(57) ABSTRACT

A spectrum analyser that includes means (8) for converting, at each of a series of frequency settings, a received radio frequency signal into an intermediate frequency signal, each intermediate frequency signal being derivable from more than one nominal received radio frequency signal. The spectrum analyser carries out a frequency analysis (14) of each intermediate frequency signal to produce a power spectrum thereof and constructs a composite received radio frequency signal power spectrum corresponding to each intermediate frequency signal power spectrum. The composite radio frequency signal power spectrums are then operated on by the spectrum analyser to provide the actual power spectrum of the received radio frequency signal.

15 Claims, 7 Drawing Sheets

METHOD AND APPARATUS FOR SPECTRUM ANALYSIS BY CREATING AND MANIPULATING CANDIDATE SPECTRA

CROSS-REFERENCES TO RELATED APPLICATIONS

Applicant claims priority of PCT application Ser. No. PCT/GB98/01868; filed May 28, 1998.

STATEMENT REGARDING FEDERALLY SPONSORED RESEARCH AND DEVELOPMENT

Not applicable.

BACKGROUND OF THE INVENTION

1. Field of the Invention

This invention relates to a spectrum analyser.

2. Description of the Related Art

Figure 1:
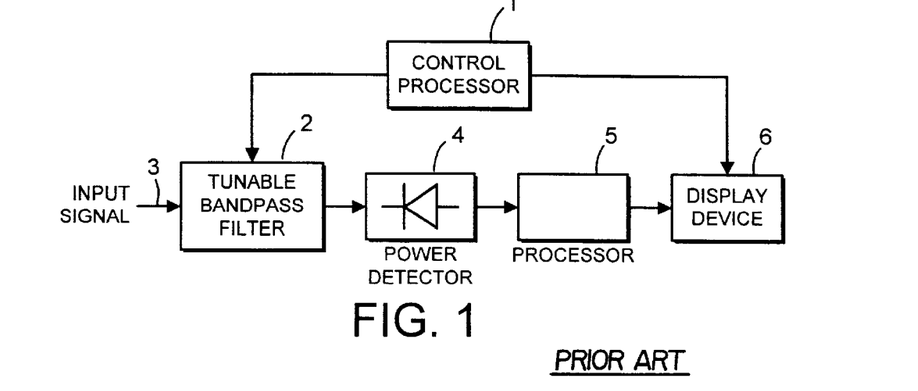
FIG. 1 is a block schematic diagram of a prior art spectrum analyser.

An ideal spectrum analyser is illustrated in FIG. 1 of the accompanying drawings. A control processor 1 tunes the bandpass filter 2 such that it passes only a selected range of the frequencies present in input signal 3. The power of this signal is detected by power detector 4. The basic output of the power detector 4 is then processed by processor 5, where the signal may be averaged to reduce noise, peak detected, and converted to a logarithmic representation, before being displayed on a display device 6. Usually, the control processor 1 will organise the display such that a graph is drawn of power versus frequency.

An RF spectrum analyser of this simple form is impractical, certainly if intended as a general purpose test instrument. The problem lies in the implementation of the tuneable filter 2. It is impractical to make a filter that has a bandwidth which is selectably wide or narrow (e.g. 3 MHz to 10 Hz) that will tune over a large RF frequency range (e.g. 10 kHz to 10 GHz). An interesting contrast to this is the optical spectrum analyser, where a cavity resonator and/or a diffraction grating can be tuned over the full range of interest, and the heterodyne techniques described to follow are not practical.

Figure 2:
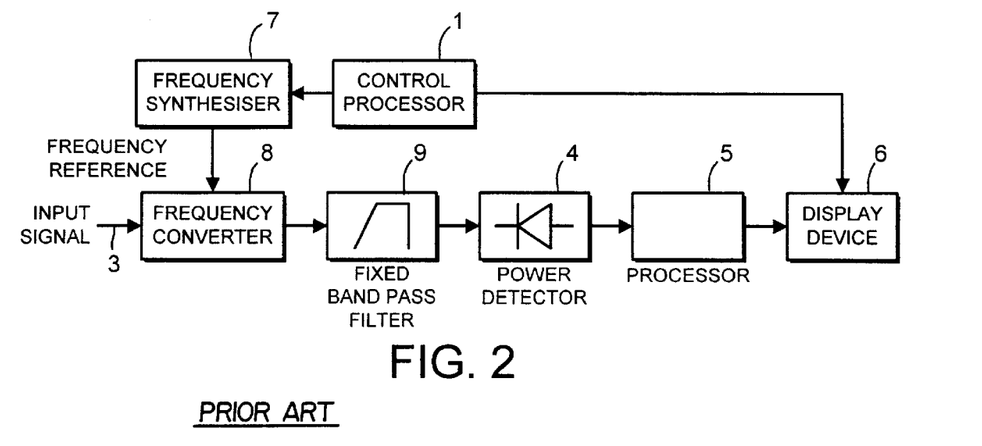
FIG. 2 is a block schematic diagram of a second prior art spectrum analyser.

A solution to the implementation problem is found with a frequency converting front end to the spectrum analyser. FIG. 2 of the accompanying drawings shows the use of such a device. Instead of tuning a bandpass filter on the input, the control processor 1 sets the frequency of a frequency synthesiser 7, which provides a frequency reference to a frequency converter 8. The function of the frequency converter 8 is to take a block of frequencies, which frequencies are related to the reference frequency, and to convert them, maintaining their relative power, into a block of frequencies with the same range, but a much lower centre frequency. This block of frequencies is passed to a fixed bandpass filter 9, where one narrow range is selected and passed on for power detection by the power detector 4.

The frequency conversion stage 8, combined with the reference synthesiser 7 and the fixed bandpass filter 9 emulates the bandpass filter 2 of FIG. 1, but frequency shifted up in frequency by an amount related to the frequency reference. As it is implemented at a fixed and low frequency, the bandpass filter 9 of FIG. 2 is possible to realise.

An ideal frequency conversion stage for use in this type of spectrum analyser has one important property, which will be called the 1:1 property: whenever signal power emerges from the frequency converter, there is always exactly one input signal at a specific frequency difference and power difference on the input signal that has caused it. The specific power difference allows the controller 1 to correctly estimate the input power that it has detected. The specific frequency difference allows the controller 1 to correctly estimate the frequency of the signal that it has detected.

Figure 3:
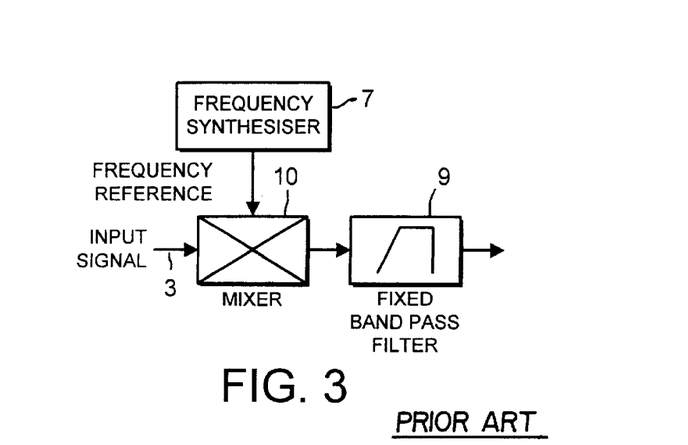
FIG. 3 is a block schematic diagram of a third prior art spectrum analyser.

It is not easy to build an ideal frequency converter. Referring to FIG. 3 of the accompanying drawings, the simplest type uses a fundamental mixer 10. Consider an input signal of 1 GHz, and a reference signal of 1.01 GHz. The frequency mixer 10 will output two signals of frequencies 2.01 GHz, and 10 MHz. The bandpass filter 9 following the mixer 10 will reject the 2.01 GHz signal, and pass the 10 MHz signal. Unfortunately, there are other input signals that can cause an output of 10 MHz. The first and most obvious is an input signal of 1.02 GHz, which being different from the reference by 10 MHz, will cause a 10 MHz output signal. In addition, non-idealities in the mixer 10 will cause input signals such as 3.02 GHz, which is 10 MHz different from the third harmonic of the reference to cause an output of 10 MHz. Thus, it can be seen that the fundamental mixer violates the 1:1 property, of only one input signal causing an output. The result of this violation would be that the spectrum analyser display would indicate the presence of input power where there was none, causing 'images' and 'spurious signals' on the display.

There are instruments that can be built using a fundamental mixer. A modulation analyser is one such instrument. Here the assumption is made that in normal operation of the instrument, the only input signal is the modulation under test. Though the simple RF front end is capable of creating images and spurious signals, these are known to be absent under normal use, and so are ignored.

A spectrum analyser cannot make the assumption of a single input signal. A measurement that is often made with a spectrum analyser is a search for signals. Here any signal seen on the display must be able to be interpreted as a genuine input signal, and not ignored as an artefact of the frequency converter.

Figure 4:
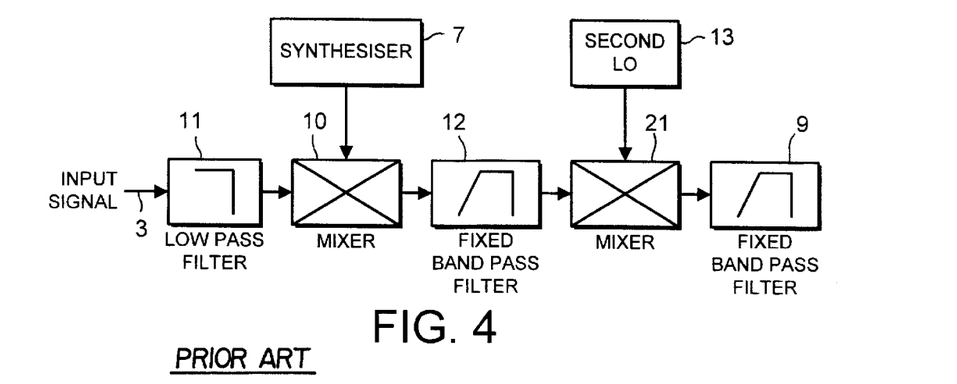
FIG. 4 is a block schematic diagram of a fourth prior art spectrum analyser.

Referring to FIG. 4 of the accompanying drawings, a more ideal frequency converter can be built with multiple mixers and filters. A low pass filter 11 passes only signals below some cut-off frequency, for instance 2 GHz. Therefore signals only in the range DC to 2 GHz are present on the mixer input. The reference synthesiser 7 generates frequencies higher than this range, for instance 3 GHz to 5 GHz, and the bandpass filter 12 is tuned to 3 GHz. This ensures that when the reference synthesiser 7 is set to a frequency of 4 GHz, only input signals with a frequency of 1 GHz will appear in the bandpass filter 12. The input lowpass filter 11 ensures that there will not be images caused by a 7 GHz input mixing with the 4 GHz reference to create a mixer output frequency also of 3 GHz. This describes the input stage of the classic 'upconversion' heterodyne receiver. While a power detector could be placed at the output of the bandpass filter 12, it is very difficult to make a narrow bandwidth filter at such a high frequency, and so one or more further stages of mixing and filtering are employed to get the final signal down to a reasonable frequency.

A second reference source 13 is used together with a second mixer 21. If the reference is chosen to be 3.01 GHz, then the output frequency in the final bandpass filter 9 will be 10 MHz. However, there are practical problems with these particular frequencies. If bandpass filter 12 contains a signal at 3.02 GHz, it too will mix down to an output of 10

MHz. It is not easy to make the bandpass filter 12 have a passband centred on 3 GHz, and also to provide adequate rejection of signals at 3.02 GHz. Without adequate rejection of these image frequencies, the complete frequency converter will violate the important 1:1 property, even though the first mixing stage does not. The best that can be routinely obtained from a typical filter at 3 GHz is to reject signals 300 MHz away from the passband. The second reference 13 must be offset more from 3 GHz, perhaps to 3160 MHz, such that the following bandpass filter 9 is centred on 160 MHz.

This final output frequency may still be too high to build narrow resolution filters. However, it is now low enough to build a filter which will discriminate against images at 10 MHz away. A further stage of mixing and filtering can now be employed to bring the final output frequency down to 10 MHz, while retaining the 1:1 property.

In the classical analogue spectrum analyser (FIG. 2), filter 9 is switch selectable between several resolution bandwidths, perhaps 100 Hz to 1 MHz, and defines the resolution bandwidth of the instrument. The power in this filter is detected by power detector 4, and represents the amount of power present at the tuned frequency. The frequency reference 7 to the frequency converter 8 is stepped or swept across a range of frequencies in order to build up a picture of power versus frequency on the display 6.

Figure 5:
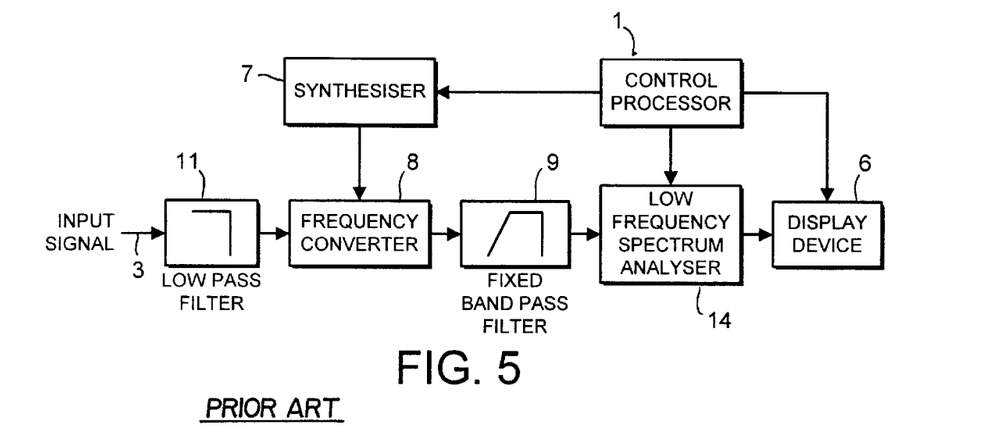
FIG. 5 is a block schematic diagram of a fifth prior art spectrum analyser.

An alternative to this analogue back end is shown in FIG. 5 of the accompanying drawings. Here bandpass filter 9 serves not to define the resolution bandwidth of the instrument, but only to define the set of frequencies coming from the frequency converter 8, and entering the low frequency spectrum analyser 14. Typically, the low frequency spectrum analyser 14 will be implemented as a high speed analogue to digital converter, followed by a digital signal processor (DSP) which implements a discrete Fourier transform (DFT). While all analogue spectrum analysers still have an advantage on absolute dynamic range performance (typically >80 dB), the digital back end is becoming more popular, especially due to its speed when implementing narrow resolution bandwidths (typically <10 kHz). The result of the DFT is power readings for a range of frequencies. If this range is not sufficient, the frequency reference may be stepped and a fresh set of readings made. The blocks of readings are then 'stitched' together to make a contiguous display.

The foregoing description, excepting the details of the frequencies and the exact number of stages, describes the RF front ends of the great majority of commercial RF spectrum analysers produced. While the standard heterodyne system can be made to work well, it has a number of disadvantages. Many stages cost more, use more power, and take up more space, than a single stage. Many stages provide more opportunity for level inaccuracies to accumulate, and for the generation of high order spurious signals in and between the many mixers. The frequencies employed within the instrument are well above the highest input frequency measured. The use of an input lowpass filter, with all of the frequency references related to it, makes for a relatively inflexible structure.

According to the present invention there is provided a spectrum analyser comprising: means for converting at each of a series of frequency settings thereof a received radio frequency signal into an intermediate frequency signal, each said intermediate frequency signal produced being derivable from more than one nominal said received radio frequency signal; means for carrying out a frequency analysis of each intermediate frequency signal to produce a power spectrum thereof; means for constructing a composite received radio frequency signal power spectrum corresponding to each said intermediate frequency signal power spectrum, said means for constructing comprising: means for determining in respect of each frequency interval of the intermediate frequency signal power spectrum which of frequency intervals of the corresponding radio frequency signal power spectrum could have given rise to the presence of a power level at that frequency interval of the intermediate frequency signal power spectrum; and means for assigning a corresponding power level to the or each said determined frequency interval of the radio frequency signal power spectrum; and means for operating on the constructed composite radio frequency signal power spectrums to provide the actual power spectrum of said received radio frequency signal.

Preferably, said means for converting comprises: a frequency synthesiser for synthesising the frequencies of said frequency settings; and a harmonic mixer for mixing each synthesised frequency with the received radio frequency signal, the nominal received radio frequency signals corresponding to each intermediate frequency signal thereby equalling $N.F_{ref} \pm IF$, where N ranges over a number of integers, $F_{ref}$ is the synthesised frequency, and IF the intermediate frequency. Alternatively, preferably, said means for converting comprises: a frequency synthesiser for synthesising the frequencies of said frequency settings; and a fundamental mixer for mixing each synthesised frequency with the received radio frequency signal, the nominal received radio frequency signals corresponding to each intermediate frequency signal thereby equalling $F_{ref} \pm IF$, where $F_{ref}$ is the synthesised frequency, and IF the intermediate frequency.

Preferably, said means for converting further comprises: a low pass filter for filtering the received radio frequency signal before it is passed to said mixer, said low pass filter thereby defining the upper frequency limit of the spectrum analyser; and a band pass filter for filtering the output of said mixer to provide said intermediate frequency signal, said band pass filter thereby defining the range of frequencies supplied to said means for carrying out a frequency analysis.

Preferably, said means for carrying out a frequency analysis comprises: means for digitising each intermediate frequency signal; and Fourier transform means for Fourier transforming each digitised intermediate frequency signal to provide its power spectrum.

In the analyser of the preceding paragraph, preferably, said means for constructing and said means for operating together comprise a control processor and memory means, said Fourier transform means storing each intermediate frequency signal power spectrum in said memory means, said control processor addressing said memory means to determine that determined by said means for determining, said control processor assigning the corresponding power levels assigned by said means for assigning and storing these power levels in said memory means thereby to construct in said memory means said composite radio frequency signal power spectrums, said control processor addressing said memory means to operate on the composite radio frequency signal power spectrums to provide the actual power spectrum of the received radio frequency signal, said control processor storing said actual power spectrum in said memory means.

In the analyser of the preceding paragraph, preferably, there is a predetermined limit to the number of composite radio frequency signal power spectrums permitted to be stored in said memory means, and once said limit has been reached said control processor examines the power levels in corresponding frequency intervals of the stored composite radio frequency signal power spectrums to determine whether a stored power level should be replaced by a current power level, and if so, which one should be replaced. Alternatively, in the analyser of the preceding paragraph, preferably, said processor means maintains a single said stored composite radio frequency signal power spectrum in said memory means, which single spectrum it continually updates in dependence on power levels subsequently assigned by said means for assigning, the final stored composite radio frequency signal power spectrum thereby being the said actual power spectrum of the received radio frequency signal.

As an alternative to the aforementioned analyser wherein said means for carrying out a frequency analysis is digital in form, preferably, said means for carrying out a frequency analysis comprises one or more band pass filters, and a power detector following the or each band pass filter.

Preferably, said means for carrying out a frequency analysis performs an initial frequency conversion of each said intermediate frequency signal.

Preferably, said means for operating determines the minimum power level present in corresponding frequency intervals of the constructed composite radio frequency signal power spectrums, and provides as the actual power spectrum of the received radio frequency signal the power spectrum comprising the determined minimum power levels. Alternatively, preferably, said means for operating determines the median of the power levels present in corresponding frequency intervals of the constructed composite radio frequency signal power spectrums, and provides as the actual power spectrum of the received radio frequency signal the power spectrum comprising the determined median power levels. Alternatively, preferably, said means for operating carries out a robust mean estimation process on the power levels present in corresponding frequency intervals of the constructed composite radio frequency signal power spectrums, and provides as the actual power spectrum of the received radio frequency signal the power spectrum comprising the power levels resulting from the robust mean estimations.

Preferably, in order to analyse signals the components of which vary with time, the following characteristics of said means for converting are selectably adjustable: the absolute times at which said frequency settings are adopted by said means for converting; the length of time for which said means for converting remains at a said frequency setting; the frequency difference between adjacent said frequency settings; and the order in which said frequency settings are adopted by said means for converting.

The present invention provides a spectrum analyser that can use simple RF front ends which do not meet the 1:1 property, for instance a fundamental mixer, a downconversion front end that converts to the final frequency in a single stage, or a harmonic mixer (sampling gate). Each of these front ends has a different cost/performance trade-off with the others, and with respect to the full conventional spectrum analyser front end.

The invention will now be described by way of example with reference to the accompanying drawings, in which.

DETAILED DESCRIPTION OF THE INVENTION

Figure 6:
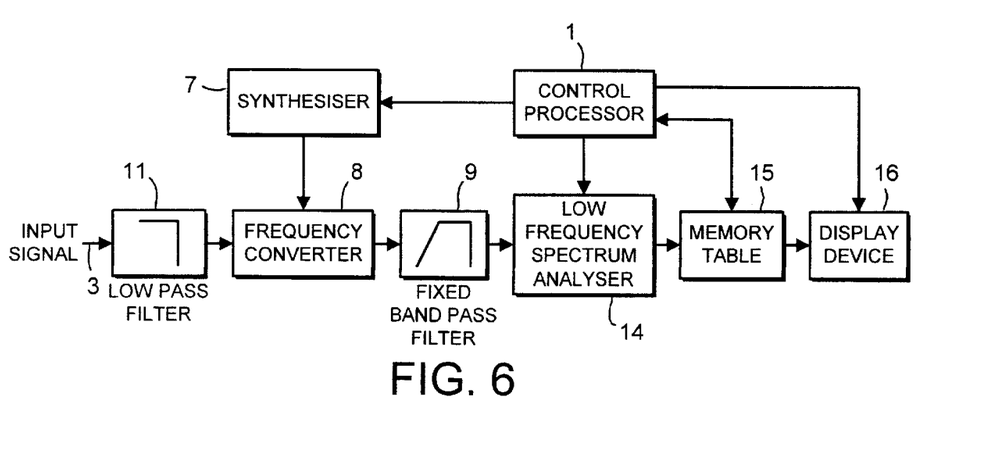
FIG. 6 shows in block schematic form a spectrum analyser according to the invention.

Referring to FIG. 6, an input signal 3 enters via a low pass filter 11. The low pass filter 11 serves to determine the upper frequency limit of the spectrum analyser, as the frequency conversion stage 8 may have a poorly determined frequency response going to very high frequencies, for instance if it is a sampling gate.

Following the frequency conversion stage 8 is a bandpass filter 9, which defines the range of frequencies entering the low frequency spectrum analyser 14. Analyser 14 is preferably implemented as a fast sampling analogue to digital converter (ADC), followed by a DSP which implements a windowed DFT via a fast Fourier transform (FFT) algorithm. The window, sample rate and FFT length together define the effective resolution bandwidth of the spectrum analyser.

If the frequency conversion stage could be relied on to have the 1:1 property, then the output from the low frequency spectrum analyser would be ready to be displayed, with no more than an appropriate display frequency shift, to ensure that the measured spectrum at the IF corresponded to the actual spectrum at the signal input. In practice, the variance of the power estimate from a single DFT is too large to accurately read the power of noisy signals, and so the power results from several DFTs would be averaged together to reduce the variance of the final answer.

If the frequency conversion stage does not have the 1:1 property, then the low frequency spectrum cannot be displayed as an accurate estimate of the spectrum of the input signal. Suppose that the frequency converter is a fundamental mixer. Consider a frequency reference of 1 GHz to the frequency converter, and an output frequency of 10 MHz. This could be caused by an input signal of either 990 MHz or 1.01 GHz, and the control processor 1 has no way of knowing which. Suppose that the frequency converter is a sampling gate (harmonic mixer) with a reference frequency of 200 MHz, and again there is an output frequency of 10 MHz. This could be caused by input frequencies of 190 MHz, 210 MHz, 390 MHz, 410 MHz, and in fact all frequencies of the form N.200 MHz+/−10 MHz where N ranges over a number of integers, up to the highest frequency defined by the input low pass filter 11 and the frequency response of the sampling gate. The controller 1 has a similar problem as with the fundamental mixer, but on a larger scale.

This problem of identifying a single frequency has already been solved in microwave frequency counters and modulation meters, under the assumption that one signal only is present at the RF input. After first determining the output frequency from the frequency converter, the reference frequency is moved to a slightly different value, and the output frequency determination is made again. The sign of the output frequency shift compared with the sign of the reference frequency shift indicates whether the input frequency is above or below the Nth harmonic of the reference frequency. The magnitude of the shift indicates the value of N.

This method works when there is one strong signal present. However, when the input can consist of an arbitrary number of signals, of unknown frequency and power, there does not exist a simple algorithm based on comparing the changes observed at the output of the frequency conversion stage with changes made at the reference frequency input.

The present invention provides a means of resolving the many ambiguities that are created by front end hardware that does not have the 1:1 property. A large table is held in a memory 15. This is organised to have as many columns are there are discrete frequencies to be resolved, labelled with the input frequency that corresponds to them. It is organised to have as many rows as there are individual measurements which comprise the total reading, labelled 0 to M−1 for M measurements. Note that the frequencies to be resolved do not necessarily have to correspond 1:1 with the resolution of the low frequency spectrum analyser.

Figure 7:
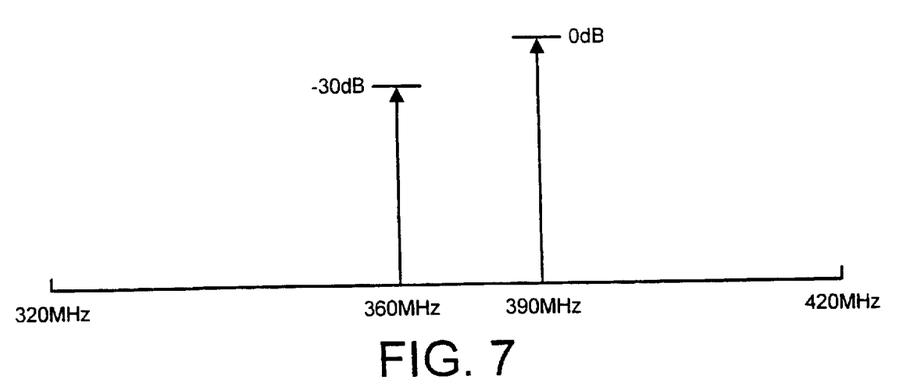
FIG. 7 shows a particular RF signal used to illustrate the operation of the spectrum analyser of FIG. 6.

To illustrate the operation, consider the RF signal shown in FIG. 7. There are two signals on the input, 360 MHz at −30 dBm, and 390 MHz at 0 dBm.

Let the frequency converter 8 be a sampling gate, driven at a frequency of approximately 50 MHz. The choice of frequencies for the sampling gate drive is somewhat arbitrary, though there must be enough different frequencies covering sufficient range that all parts of the candidate spectrum table (see below) have a sufficient number of entries. The output spectrum display is required to go from 320 MHz to 420 MHz. The low frequency spectrum analyser can measure signals only in the range 3 MHz to 20 MHz. Thus, fixed band pass filter 9 is chosen to have this range.

Measurement number 0 is made with an LO (synthesiser 7) frequency of 49 MHz. This converts the 360 MHz signal to an IF of 17 MHz, and the 390 MHz signal into an IF of 2 MHz. Due to the IF low frequency limit, the 2 MHz IF signal is not recorded by the LF spectrum analyser.

Figure 8A:
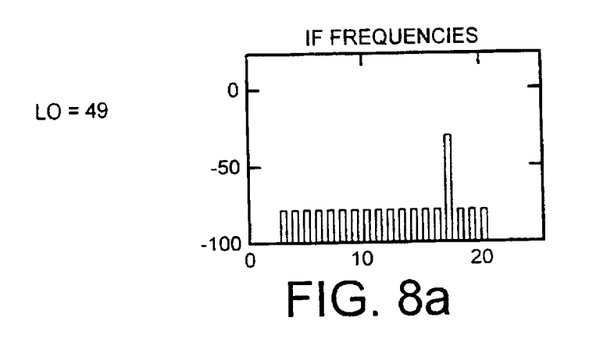
FIG. 8a shows an intermediate frequency signal spectrum produced using the spectrum analyser of FIG. 6 to analyze the RF signal of FIG. 7 with an LO frequency of 49 MHz.
Figure 8B:
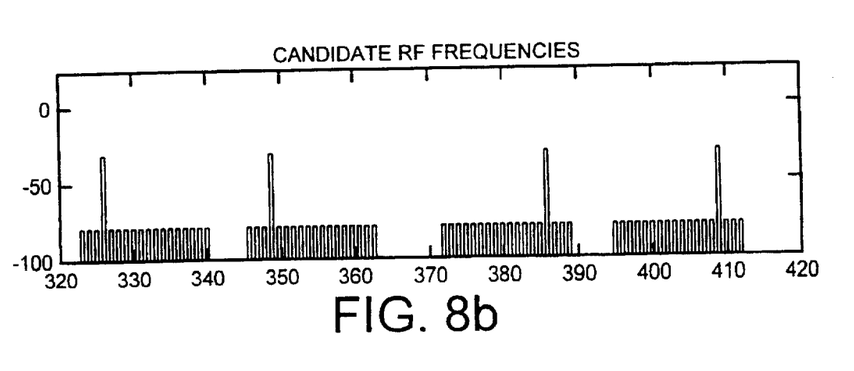
FIG. 8b shows a composite received RF signals spectrum produced using the spectrum analyser of FIG. 6 to analyze the RF signal of FIG. 7 with an LO frequency of 49 MHz.

The first row of the candidate table is now filled in, with the measured power levels being entered at all possible frequency positions that could have caused the IF signal, that is all frequencies of the form N.49 MHz+/−IF. FIG. 8*a* shows the IF spectrum, and FIG. 8*b* shows a graph of the entries in the candidate table after the level measurements have been filled in. It is apparent that not all frequencies in the table have had power levels entered, these are frequencies which do not correspond to any IF frequency. If the table is used in this relatively inefficient fashion, using one row per LO frequency, then the entries in these cells will be a token indicating that there is no valid power for this frequency. The principal strong signal has been entered at N.49 MHz+/−17 MHz, or frequencies of 326 MHz, 360 MHz, 375 MHz and 409 MHz.

Figure 9A:
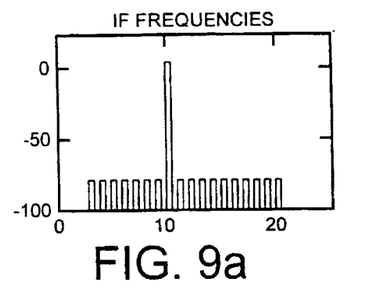
FIG. 9a shows an intermediate frequency signal spectrum produced using the spectrum analyser of FIG. 6 to analyze the RF signal of FIG. 7 with an LO frequency of 50 MHz.
Figure 9B:
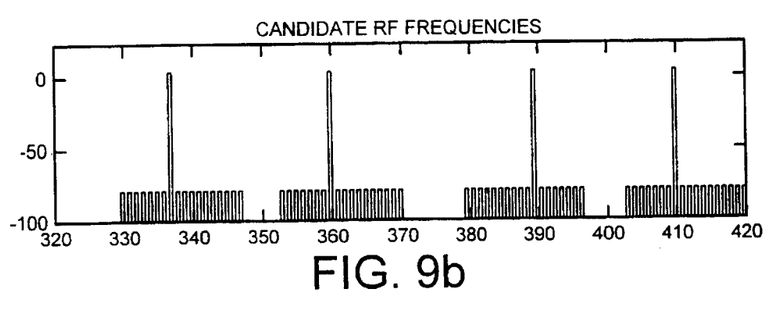
FIG. 9b show a composite received RF signals spectrum produced using the spectrum analyser of FIG. 6 to analyze the RF signal of FIG. 7 with an LO frequency of 50 MHz.

Measurement number 1 is made with an LO frequency of 50 MHz. This happens to mix both signals down to an IF of 10 MHz. The power spectrum in the IF consists of a single line at 10 MHz, with a power of about 0 dBm. The second row in the candidate table is filled in as for the first one. The IF spectrum for an LO of 50 MHz is shown in FIG. 9*a*, FIG. 9*b* shows the candidate RF spectrum that is entered in the table.

Figure 10A:
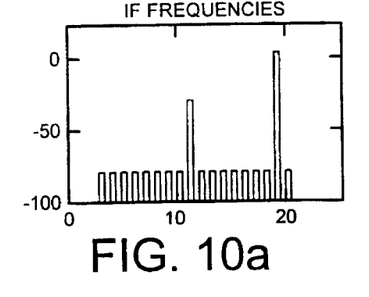
FIG. 10a shows an intermediate frequency signal spectrum produced using the spectrum analyser of FIG. 6 to analyze the RF signal of FIG. 7 with an LO frequency of 53 MHz.
Figure 10B:
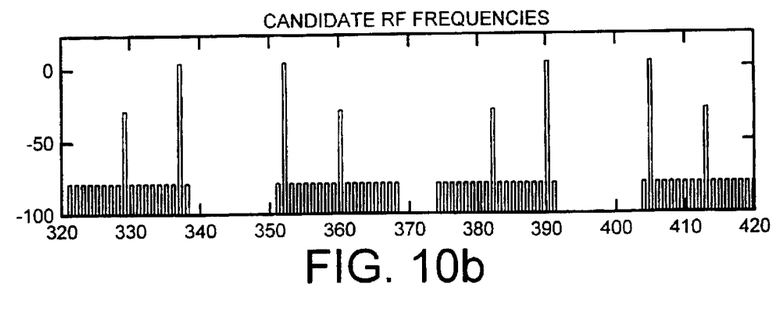
FIG. 10b shows a composite received RF signal spectrum produced using the spectrum analyser of FIG. 6 to analyze the RF signal of FIG. 7 with an LO frequency of 53 MHz.
Figure 11A:
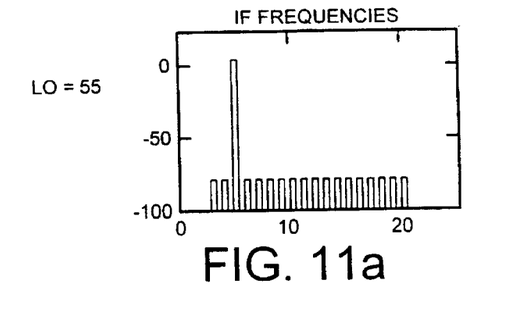
FIG. 11a shows an intermediate frequency signal spectrum produced using the spectrum analyser of FIG. 6 to analyze the RF signal of FIG. 7 with an LO frequency of 55 MHz.
Figure 11B:
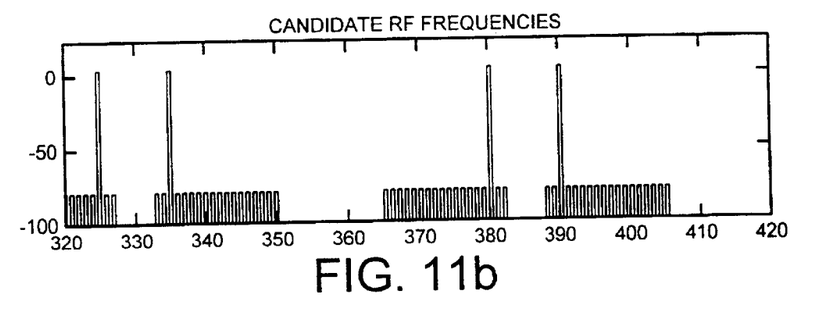
FIG. 11b shows a composite received RF signal spectrum produced using the spectrum analyser of FIG. 6 to analyze the RF signal of FIG. 7 with an LO frequency of 55 MHz.
Figure 12A:
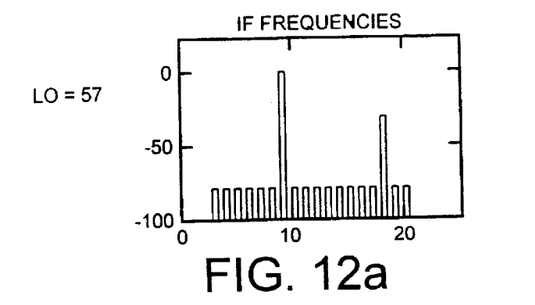
FIG. 12a shows an intermediate frequency signal spectrum produced using the spectrum analyser of FIG. 6 to analyze the RF signal of FIG. 7 with an LO frequency of 57 MHz.
Figure 12B:
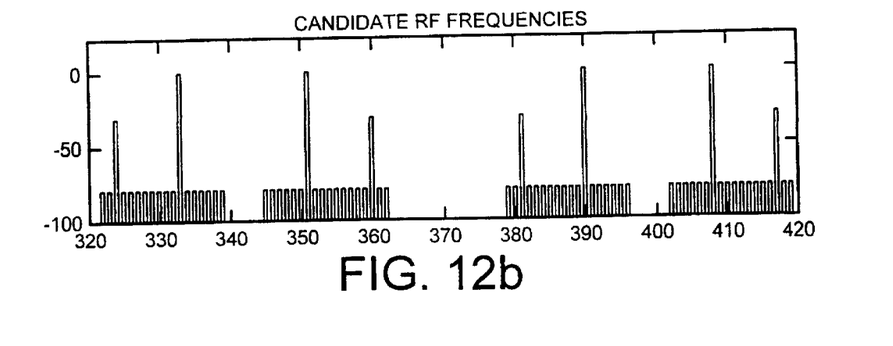
FIG. 12b shows a composite received RF signal spectrum produced using the spectrum analyser of FIG. 6 to analyze the RF signal of FIG. 7 with an LO frequency of 57 MHz.
Figure 13A:
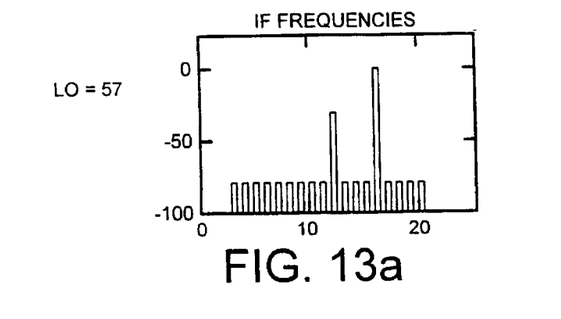
FIG. 13a shows an intermediate frequency signal spectrum produced using the spectrum analyser of FIG. 6 to analyze the RF signal of FIG. 7 with an LO frequency of 58 MHz.
Figure 13B:
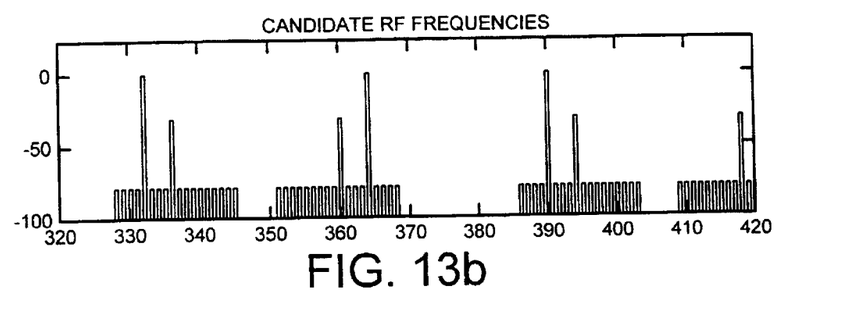
FIG. 13b shows a composite received RF signal spectrum produced using the spectrum analyser of FIG. 6 to analyze the RF signal of FIG. 7 with an LO frequency of 58 MHz.
Figure 14A:
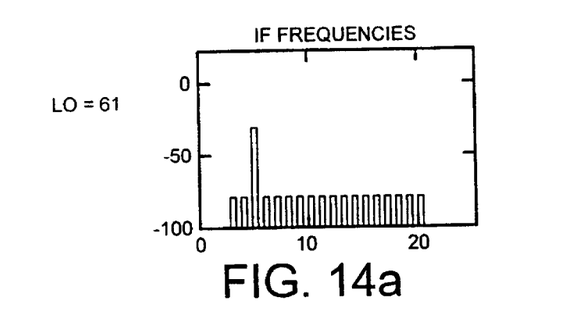
FIG. 14a shows an intermediate frequency signal spectrum produced using the spectrum analyser of FIG. 6 to analyze the RF signal of FIG. 7 with an LO frequency of 61 MHz.
Figure 14B:
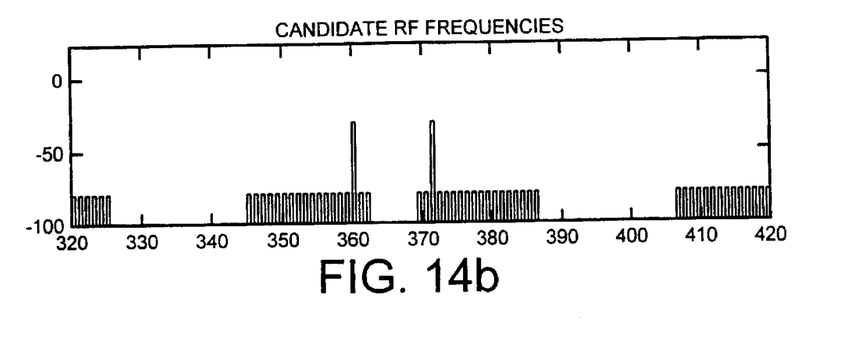
FIG. 14b shows a composite received RF signal spectrum produced using the spectrum analyser of FIG. 6 to analyze the RF signal of FIG. 7 with an LO frequency of 61 MHz.

Measurement number 2 is made with an LO frequency of 53 MHz. The 360 MHz signal now produces an IF of 11 MHz at 0 dBm, the 390 MHz input signal an IF of 19 MHz at −30 dBm. These signals are now entered into the table at N.53 MHz+/−IF. This is the first LO frequency for which both of the input signals have produced mixing products in the valid IF range. The IF spectrum, and candidate RF spectrum are shown in FIGS. 10*a* and 10*b*.

Measurement numbers 3 to 6 are now made at LO frequencies of 55 MHz, 57 MHz, 58 MHz and 61 MHz. The IFs produced are again entered into the table as candidate RF spectra. These are shown in FIGS. 11, 12, 13 and 14.

Figure 15:
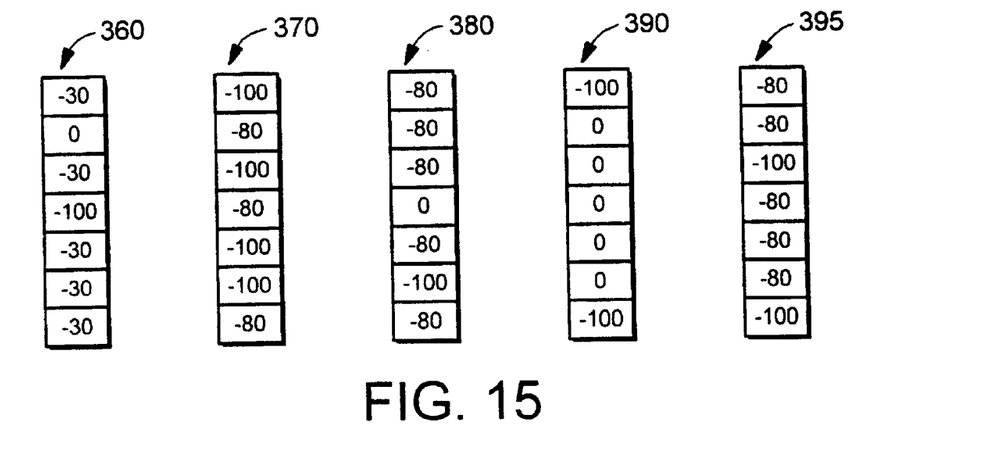
FIG. 15 illustrates power level entries in a memory of the analyser of FIG. 6, which power levels are those of the composite received RF signal spectrums.

Each IF spectrum is stored in memory table 15. Thus, to create the corresponding candidate RF spectrum, control processor 1 addresses memory table 15, and, using the LO frequency which it has set, calculates which of frequency intervals of the RF spectrum could have given rise to the presence of the power levels present in the IF spectrum. Control processor 1 then stores in memory table 15 corresponding power levels at the calculated frequency intervals thereby creating the corresponding candidate RF spectrum, Once the candidate RF table has been filled, each column is examined to determine the power of the input signal present at that frequency. Several of the columns are illustrated in FIG. 15. The noise level in the IF is assumed to be −80 dB, and the token that indicates that no power could be assigned to that RF frequency for that measurement is −100 dB.

Consider the column for 380 MHz. There is one entry of 0 dB for measurement number 3, which was an LO frequency of 55 MHz, several entries of the IF noise floor, and one 'no entry' token. Although there is one entry of 0 dB, if a 380 MHz was actually present at the RF input, then every LO frequency which would have resulted in a valid IF signal being mapped to that frequency would show a 0 dB entry. However, the 380 MHz column shows several power level entries of −80 dB. Therefore the maximum signal that can be present at 380 MHz input is −80 dB.

Next consider the column for 390 MHz. There are two 'no entry' tokens, and 5 entries of 0 dB. It is clear that this frequency corresponds to an input signal, as every valid entry corresponds to the input signal power level.

The 360 MHz column shows one entry of 0 dB, 5 entries of −30 dB and one 'no entry' token. The 0 dB entry can be identified as a spurious signal, with the input corresponding level being −30 dB.

The 370 MHz column shows only 3 valid entries, and 4 entries that did not produce a valid IF frequency. In this example, 3 valid readings happens to be enough to produce a correct result, and would also have done so had one spurious signal occurred in this frequency range. However, in practice, 3 valid readings would not be sufficient to give good confidence that all spurious signals had been rejected. The number of LO frequencies and the frequencies themselves needs to be chosen to ensure that all frequencies in the output range do get a sufficient number of valid entries.

It is clear that the 'filtering' operation that needs to be applied to the columns is not the mean. One possible operation is the minimum valid signal. This will reject all spurious signals, though will not take advantage of the averaging that is possible with the multiple readings. Another is the median of all valid signals. This also rejects spurious signals (as long as too many spurious entries do not occur at this frequency) and reduces the variance of the final reading. The median also performs very nearly as well as the best algorithm now to be described.

The best algorithm for dealing with the entries in each frequency column is a multipass process which first identifies spurious signals, as being a small number of large entries, and then eliminates these from further operations. The remaining valid entries are averaged to make a first estimate of the correct answer. The mean absolute difference, MAD, is then calculated for all of the entries. A new weighted mean is then calculated, giving a large weight to values close to the mean, and a zero weight to entries which are more than several MAD away from the mean. This process is iterated several times, until the weighted mean stops varying. This has the effect of eliminating from the average, spurious signals which cannot be safely recognised in the first pass of this process. This method for estimating the true value of several measurements is one example of so called 'robust' estimators, which allow for data contaminated with non- Gaussian noise. The contamination caused by the occurrence of spurious entries, and from moving, intermittent, modulated or noisy signals is non-Gaussian.

Other algorithms are possible, as long as they are capable of rejecting large spurious signals, preferably adaptively, and taking some sort of mean of the remaining signals.

The algorithm used is carried out by control processor 1, by addressing memory table 15 where the candidate RF spectra are stored. Control processor 1 stores the resulting final RF power spectrum in memory 15. It is displayed on display device 16.

Figure 16:
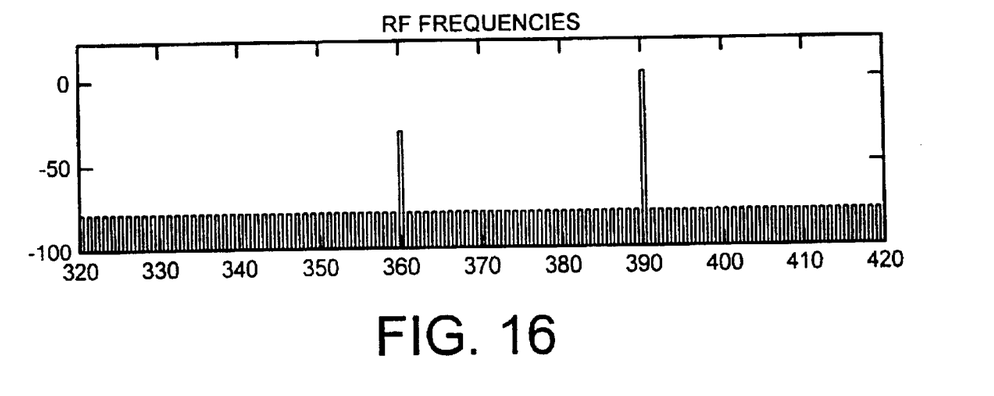
FIG. 16 shows the power spectrum produced by an appropriate mathematical combination of the composite received RF signal spectrums.

FIG. 16 shows the resulting Final RF spectrum where a simple median filter has been applied to all valid entries in each frequency column. The two inputs signals at 360 MHz and 390 MHz are clearly identified, and all spurious copies of them have been eliminated. The IF noise level of −80 dB is shown.

The LO frequency step resolution, the low frequency spectrum analyser resolution and the candidate table frequency resolution in the above example were all 1 MHz. In practice, there is no need for these three frequency resolutions to be equal, or even rationally related. When the low frequency spectrum analyser resolves an input signal that has only a line spectrum, the power of this signal will fall into several adjacent resolution bins. These bins can be mapped to the closest bins in the candidate RF table, or can be mapped by interpolation of the frequency.

The present day availability of large cheap memories enhances the viability of the aforedescribed technique. Even so, it might still be required to use memory more efficiently than as presented above. For instance, in the case where a large number of signal averages is required to reduce the variance of the noise sufficiently. In this case, it will be adequate to use a few memory cells per candidate frequency, e.g. 10. For the first 10 LO settings that produce valid IF signals, these cells are filled in the normal way. Subsequently, each new power level that is mapped into this frequency bin is compared against the statistics of the readings already present. One method is to reject the maximum and minimum signals for each two new readings received. This means that the median of the surviving readings is the median of all readings mapped into that frequency. Other methods are possible, for instance the robust method above could be modified to maintain a running mean and running MAD of the data, with a small consequent loss in performance through having lost historical data.

The algorithms above work where the RF environment is known to be stationary, i.e. sources are not hopping, pulsed, frequency modulated over a range wider than the resolution of the IF spectrum analyser, or otherwise time-varying. Note that if a source is frequency modulated over a deviation of less than a resolution bandwidth, the signal power will appear at all times at its nominal frequency. If the RF input is known or suspected to be non-stationary, then the analysis has to be more sophisticated. A conventional spectrum analyser may not show hopped signals at all, and may show artefacts when displaying FM signals or pulsed signals, depending on the details of its sweep synchronisation with the signal.

Two cases have to be distinguished. The first is where non-stationary signals are present in the input frequency range of the instrument, but outside the desired display range. The second case is where the non-stationary signals are required to be displayed. A test for time-varying input signals in the display range is to choose a small set of LO frequencies that gives complete cover over the desired display frequency range, and repeat this set of frequencies several times. If rows of the candidate RF table do not match for corresponding LO frequencies, at a level which allows for the normal noise variance of readings, then displayable time varying signals are indicated.

In the first case, the spurious IF frequencies caused by out of display range signals are rejected in the final processing exactly as before, however pulsed signals should cause less likelihood of false decisions than for stationary signals as they are present for less of the time. Hopped and frequency modulated signals should be no worse than for stationary spurious signals, assuming no unfortunate correlation between the signals and the set of LO frequencies. The example above used a monotonically increasing set of LO frequencies. A pseudo-random order for LO frequencies will minimise the possibility of the signal frequency correlating with the LO movement and causing errors by spuriously appearing at one possible output frequency too many times.

In the second case, the LO signal is made to dwell at each frequency setting for a relatively long period of time, while statistics are collected of the signal behaviour in the IF. If a signal is present for every measurement, then it is a stationary signal. If it appears regularly, then it is likely to be a pulsed or a regularly frequency modulated signal. If it appears irregularly, it is likely to be hopped or an irregularly modulated signal. The analyser dwells on this frequency long enough to observe several cycles of the lowest period of signal variation that it expects to find. Obviously a completely unknown signal may have a very long period, but this signal would in any case not be observable on a conventional spectrum analyser. Generally, time varying signals of importance to RF measurement have short periods, such as pulsed and hopped GSM signals, or FM broadcast signals carrying audio modulation.

Once signals that appear in the IF only occasionally have been tentatively identified as such, they are entered into the candidate RF table as before, as an RF level or level range, together with a tag that identifies their possible type. A new LO frequency is chosen and the process is repeated. After a sufficient number of LO frequencies have been used, the candidate RF table is analysed as before.

What is claimed is:

1. A spectrum analyzer comprising:
   a) a frequency converter for operating on a received radio frequency (RF) signal to produce a plurality of intermediate frequency (IF) signals, each IF signal being produced at a respective frequency setting of the converter;
   b) an assessor for determining the power spectrum of each IF signal, each IF power spectrum comprising a number of frequency intervals each having a power level;
   c) a constructor arranged to operate on each IF power spectrum to produce a plurality of potential RF power spectrums, such that a potential RF spectrum is produced for each IF power spectrum, wherein the constructor is configured to process an IF power spectrum to construct a respective potential RF spectrum by assessing each frequency interval of the IF power spectrum being processed to determine for each assessed frequency interval a plurality of candidate frequency intervals of the received RF signal that could have produced the power level at the assessed frequency interval, the constructor assigning the power level of each assessed frequency interval to its plurality of associated candidate frequency intervals; and
   d) a discriminator for combining the potential RF power spectrums to produce, via a statistical technique, the actual power spectrum of said received RF signal.

2. An analyzer according to claim 1, wherein said frequency converter comprises:
   i) a frequency synthesizer for synthesizing the frequencies of said frequency settings; and
   ii) a harmonic mixer for mixing each synthesised frequency with the received RF signal, such that the candidate frequency intervals corresponding to an arbitrary frequency interval $F_{if}$ are given by $N.F_{ref} \pm F_{if}$, where N is any positive integer and $F_{ref}$ is the synthesised frequency.

3. An analyzer according to claim 1, wherein said frequency converter comprises:
   i) a frequency synthesizer for synthesizing the frequencies of said frequency settings; and
   ii) a fundamental mixer for mixing each synthesised frequency with the received RF signal, such that the candidate frequency intervals corresponding to an arbitrary frequency interval $F_{if}$ are given by $F_{ref} \pm F_{if}$, where $F_{ref}$ is the synthesised frequency.

4. An analyzer according to claim 1, further comprising: a low pass filter for filtering the received RF signal before it is passed to said frequency converter, said low pass filter thereby defining the upper frequency limit of the spectrum analyzer.

5. An analyzer according to claim 1, wherein said constructor comprises: a digitizer for digitizing each IF signal; and a Fourier transformer for Fourier transforming each digitized signal to provide its power spectrum.

6. An analyzer according to claim 5, wherein said constructor and said discriminator together comprise a control processor and a memory, said Fourier transformer storing each IF signal power spectrum in said memory, said control processor addressing said memory to determine the candidate frequency intervals determined by said constructor, said control processor assigning the power levels assigned by said constructor and storing these assignations in said memory thereby to construct in said memory said potential RF power spectrums, said control processor addressing said memory to operate on the potential RF power spectrums to provide the actual power spectrum of the received RF signal, said control processor storing said actual power spectrum in said memory.

7. An analyzer according to claim 6, wherein there is a predetermined limit to the number of potential RF power spectrums permitted to be stored in said memory, and once said limit has been reached said control processor examines the power levels in corresponding frequency intervals of the stored potential RF power spectrums to determine whether a stored power level should be replaced by a current power level, and if so, which one should be replaced.

8. An analyzer according to claim 6, wherein said processor maintains a single said stored potential RF power spectrum in said memory, which single spectrum it continually updates in dependence on power levels subsequently assigned by said constructor, the final stored potential RF power spectrum thereby being the actual power spectrum of the received RF signal.

9. An analyzer according to claim 1, wherein said assessor comprises one or more band pass filters, and a power detector following the or each band pass filter.

10. An analyzer according to claim 1, wherein said assessor is arranged to perform an initial frequency conversion of each said IF signal.

11. An analyzer according to claim 1, wherein said discriminator determines the minimum power level present in corresponding frequency intervals of the potential RF power spectrums, and provides as the actual power spectrum of the received RF signal the power spectrum comprising the determined minimum power levels.

12. An analyzer according to claim 1, wherein said discriminator determines the median of the power levels present in corresponding frequency intervals of the candidate RF power spectrums, and provides as the actual power spectrum of the received RF signal the power spectrum comprising the determined median power levels.

13. An analyzer according to claim 1, wherein said discriminator carries out a robust mean estimation process on the power levels present in corresponding frequency intervals of the candidate RF signal power spectrums, and provides as the actual power spectrum of the received RF signal the power spectrum comprising the power levels resulting from the robust mean estimations.

14. An analyzer according to claim 1, wherein in order to analyze signals, the components of which vary with time, the following characteristics of said frequency converter are selectably adjustable: the absolute times at which said frequency settings are adopted by said frequency converter; the length of time for which said frequency converter remains at a said frequency setting; the frequency difference between adjacent said frequency settings; and the order in which said frequency settings are adopted by said frequency converter.

15. A method of analyzing the spectrum of a received radio frequency (RF) signal, the method comprising the steps of:

a) frequency converting the RF signal at each of a plurality of frequency settings to produce a plurality of intermediate frequency (IF) signals, each IF signal being produced at a respective frequency setting;

b) determining the power spectrum of each IF signal, each IF power spectrum comprising a number of frequency intervals each having a power level;

c) constructing a plurality of potential RF spectrums, each corresponding to a respective IF power spectrum, wherein constructing a potential RF power spectrum comprises:

i) assessing each frequency interval of the corresponding IF power spectrum to determine a plurality of candidate frequency intervals of the received RF signal that could have produced a power level at that frequency interval; and    ii) assigning the power level of each assessed frequency interval to its plurality of associated candidate frequency intervals;

d) combining the potential RF power spectrums to produce, via a statistical technique, the actual power spectrum of said received RF signal.

* * * * *

UNITED STATES PATENT AND TRADEMARK OFFICE
CERTIFICATE OF CORRECTION

PATENT NO.     : 6,392,397 B1                                         Page 1 of 1
DATED          : May 21, 2002
INVENTOR(S)    : Neil Edwin Thomas It is certified that error appears in the above-identified patent and that said Letters Patent is hereby corrected as shown below:

Column 1,
Line 9, after "filed" delete "May 28, 1998." and insert therein -- June 28, 1998. --

Column 3,
Lines 59-60, between paragraphs insert label -- Brief Summary of the Invention: --

Column 5,
Lines 59-60, between paragraphs insert label -- Brief Description of the Several Views of the Drawing(s): --

Column 7,
Lines 65-66, after "many columns" delete "are" and insert therein -- as --

Column 8,
Lines 7-8, after "on the input" delete "360 MHz at -30dBm, and 390 MHz at 0dBm." and insert therein -- 360MHz at 0dBm, and 390 MHz at -30dBm. --

Signed and Sealed this

Twelfth Day of November, 2002

Attest:

Attesting Officer

JAMES E. ROGAN
Director of the United States Patent and Trademark Office